(12) United States Patent
Gohel et al.

(10) Patent No.: US 7,395,479 B2
(45) Date of Patent: Jul. 1, 2008

(54) OVER-VOLTAGE TEST FOR AUTOMATIC TEST EQUIPMENT

(75) Inventors: Tushar K. Gohel, Wakefield, MA (US); Michael F. McGoldrick, North Reading, MA (US)

(73) Assignee: Teradyne, Inc., Boston, MA (US)

( * ) Notice: Subject to any disclaimer, the term of this patent is extended or adjusted under 35 U.S.C. 154(b) by 382 days.

(21) Appl. No.: 11/036,850

(22) Filed: Jan. 14, 2005

(65) Prior Publication Data

US 2006/0161827 A1 Jul. 20, 2006

Related U.S. Application Data

(60) Provisional application No. 60/640,883, filed on Dec. 30, 2004.

(51) Int. Cl.
*G01R 31/28* (2006.01)
*G06F 11/00* (2006.01)

(52) U.S. Cl. .................. 714/742; 714/703; 714/736

(58) Field of Classification Search .......... 714/703, 714/724–725, 732, 736, 738, 741–742, 819, 714/22, 46–48

See application file for complete search history.

(56) References Cited

U.S. PATENT DOCUMENTS

| | | | |
|---|---|---|---|
| 5,124,849 A * | 6/1992 | Chur ..................... 360/31 |
| 6,396,742 B1 * | 5/2002 | Korsh et al. ............ 365/185.22 |
| 6,489,798 B1 * | 12/2002 | Scott-Thomas et al. ..... 324/765 |
| 6,563,352 B1 | 5/2003 | Gohel et al. |
| 6,870,384 B1 * | 3/2005 | Ricca .................... 324/763 |
| 2004/0056666 A1 | 3/2004 | Gohel |
| 2004/0128121 A1 | 7/2004 | Truebenbach et al. |

* cited by examiner

*Primary Examiner*—Phung M Chung
(74) *Attorney, Agent, or Firm*—Wolf Greenfield & Sacks

(57) ABSTRACT

Automatic test equipment including a digital test instrument that may test for and respond to over-voltage conditions. Information on over-voltage conditions may be used in detecting or diagnosing fault conditions within a system under test. Over-voltage conditions may be monitored as part of a test to determine the time and the channels on which they occur. A test may fail if an over-voltage condition is detected and the results of the test may indicate when and where the over-voltage condition occurred. Alternatively, indications of over-voltage conditions may be used to alter the test environment. In response to an over-voltage condition, units under test may be disconnected from the test environment to avoid exposing circuitry within those units to voltage levels that may damage or stress components. Alternatively, indications of an over-voltage condition may be used to disconnect from the test environment equipment that may be generating the over-voltage conditions. Over-voltage conditions are detected in a digital test instrument by additional comparators included in the channel electronic circuits of the test instrument.

13 Claims, 5 Drawing Sheets

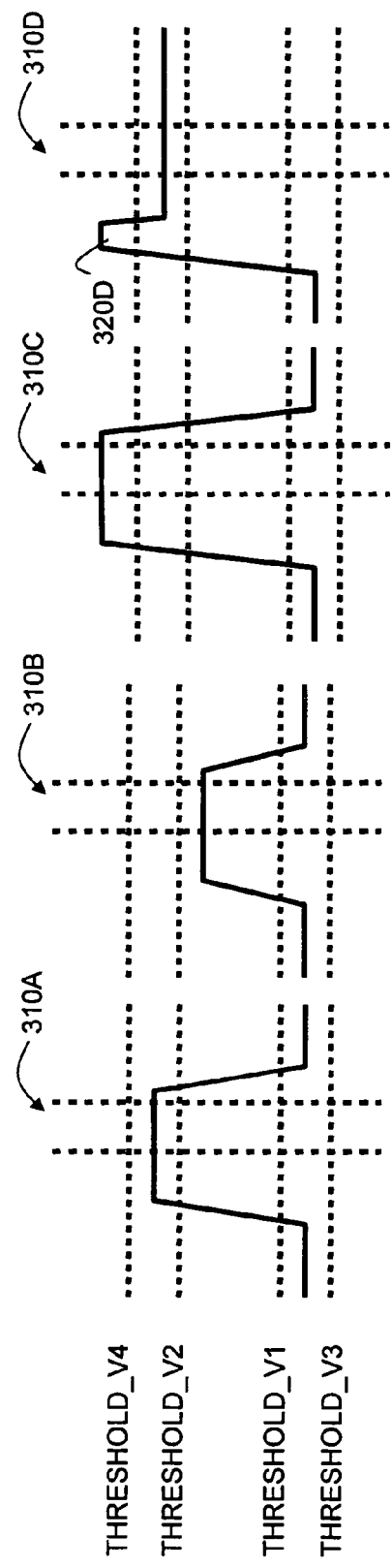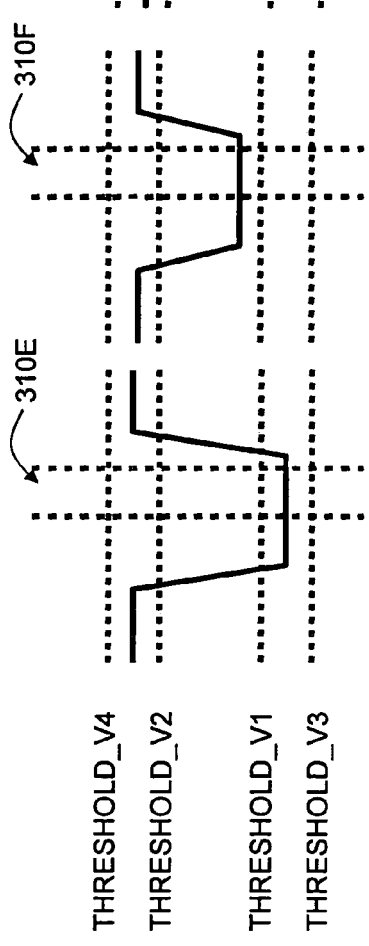

OVER-VOLTAGE TEST FOR AUTOMATIC TEST EQUIPMENT

This application claims priority under 35 U.S.C. § 119(e) to U.S. Provisional Application Ser. No. 60/640,883, entitled "OVER-VOLTAGE TEST FOR AUTOMATIC TEST EQUIPMENT," filed on Dec. 30, 2004, which is herein incorporated by reference in its entirety.

BACKGROUND OF INVENTION

1. Field of Invention

This invention relates to generally to electronic systems and more specifically to test systems.

2. Discussion of Related Art

Test systems are often used to verify the performance of electronic devices. An electronic device (sometimes referred to as a Unit Under Test) may be tested as a stand alone unit or may be integrated into a test environment that simulates the operating conditions of the device. The test environment may include a digital test instrument that generates and measures digital signals provided to the unit under test. The test environment may also include power supplies and instruments that generate and measure analog signals to be able to fully simulate the intended operating environment of the unit under test.

The Unit Under Test (UUT) typically goes through a testing phase performed by Automatic Test Equipment (ATE). ATE operates under the control of test software, often running on a host computer. The ATE is programmed to provide stimulus to a particular circuit or component in the UUT and then measure the output to determine if the UUT has performed to its specifications. ATE may include a digital test instrument that has multiple digital channels. Each digital channel may include a driver and a detector to generate and/or measure a digital signal. The driver output and detector input may be connected together to allow for bi-directional operation.

The driver circuit usually has two or more user programmable levels. Programmable drive levels allow the tester to emulate the logic family of any device they are testing. Most logic families require only two drive levels to account for a logic high and a logic low. An additional drive level can be used as an idle state or a termination level when receiving a signal.

The detector circuit usually has two user programmable thresholds. Although a single threshold can be used to specify the logic state that the UUT is driving, dual-threshold detection is often used in digital channels of test equipment to verify that the UUT is driving or receiving voltages above the specified high voltage or below the specified low voltage. Conformance to these voltage specifications is required to reliably test the UUT.

Some test instruments include protective circuitry that isolates circuitry in the test instrument from an input when the voltage and/or current applied at the input exceeds a rated value. Traditional and solid state fuses are used for this purpose. Also, switches have been used along with a voltage sensing circuit that activates the switch to disconnect the test instrument from an input when the voltage or current at the input exceeds a specific value.

It would be desirable to have an improved test system.

SUMMARY OF INVENTION

In one aspect, the invention relates to automatic test equipment adapted to execute a user program. The test equipment comprises a channel circuit having a signal connection point adapted to be coupled to a signal line of a unit under test to receive an input signal having a value. The channel circuit comprises at least two comparison sub-circuits, each comparison sub-circuit having a signal input coupled to the signal connection point, a threshold input adapted to receive a threshold input signal having a value and a comparison output, and wherein each of the comparison sub-circuits is adapted to produce a comparison output signal at the comparison output having a value indicating the value of the input signal relative to the value of the threshold input signal; and control circuitry having at least two measured value inputs, each measured value input coupled to the comparison output of one of the at least two comparison sub-circuits, a test output and an over-voltage output, the control circuitry adapted to generate a test output from a first subset of the comparison output signals produced by the at least two comparison sub-circuits and to generate the over-voltage output from a second subset of the comparison output signals produced by the at least two comparison sub-circuits. The automatic test equipment is adapted to independently set the value of the threshold input signal for each of the at least two comparison sub-circuits based on the user program.

In another aspect, the invention relates to automatic test equipment of the type having a plurality of signal connection points. The automatic test equipment comprises a plurality of circuits, each of the circuits having a signal input coupled to a respective one of the signal connection points and adapted to receive as an input signal a signal at the signal connection point. The test equipment is adapted to compare the value of the input signal to at least one expected value to generate a test result. Each of the circuits comprises: a threshold input adapted to receive at least one threshold input signal having a value; a comparison sub-circuit coupled to the threshold input and the signal input, the comparison sub-circuit having a comparison output indicating the value of the input signal relative to the value of the threshold input signal; and control circuitry having a measured value input coupled to the comparison output of the comparison sub-circuit to receive a measured value signal having a value, the control circuitry adapted to generate an output based on the value of the measured value signal, with the output being a test result and/or being an over-voltage indication.

In a further aspect, the invention relates to a method of operating automatic test equipment comprising: sensing with the automatic test equipment the signal on each of a plurality of lines; determining the level on each of the plurality of lines relative to an expected level; and determining the level on each of the plurality of lines relative to an over-voltage level.

Other aspects of the invention, as well as specific embodiments, are described below.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIGS. 3A-3H are sketches illustrating waveforms that may be processed by a digital test system illustrated in FIG. 2A.

DETAILED DESCRIPTION

Figure 1:
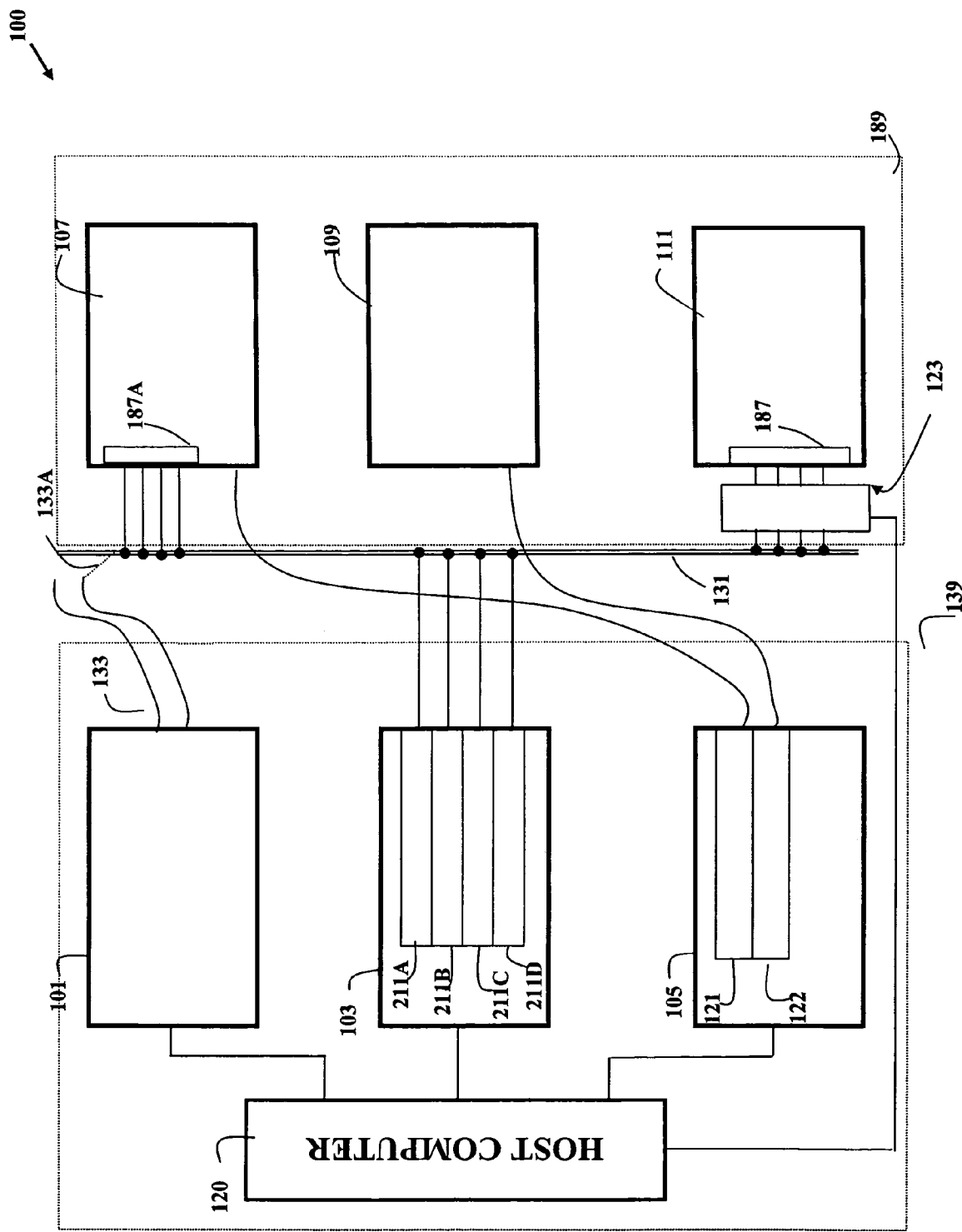
FIG. 1 is a simplified block diagram of a testing environment.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

FIG. 1 shows a test environment 100. The test environment 100 includes automatic test equipment 139 and a system under test 189. Test environment 100 is constructed to allow verification of proper operation of a UUT within its intended operating environment. Here, system under test 189 is illustrated as containing electronic device 107, electronic device 109 and a particular unit under test, UUT 111. The configuration of the system under test 189 is not critical to the invention. But, as a specific example, electronic device 107, electronic device 109 and UUT 111 may be printed circuit cards installed in a card cage. Some or all of the cards may be connected through a digital bus 131.

ATE 139 includes multiple instruments that may generate and measure signals. A host computer 120 executes a software program that controls operation of each of the instruments and receives outputs from each of the instruments.

Host computer 120 may be programmed to analyze these outputs to determine whether the system under test 189 is operating properly. Such programming is traditionally a part of a user program and drives programmed values and compares measured values to expected values on one or more signal lines connected to the UUT. These steps may be programmed for multiple lines for multiple test cycles. As described in greater detail below, ATE 139 may also be programmed to specify an over-voltage threshold and use measurements indicating whether, at times which may also be programmable, an over-voltage condition has occurred. These measurements may be used to protect the test equipment, the UUT, or other components of the system. These measurements of over-voltage conditions may also be evaluated by the user program to determine whether the UUT is working properly.

In the example of FIG. 1, ATE 139 includes power supply 101, digital test instrument 103 and analog test instrument 105. The numbers and types of test instruments included in ATE 139 depends on the specific system under test. The specific configuration shown should not be construed as a limitation on the invention.

In FIG. 1, power supply 101 provides a relatively high current and high voltage dc signal that may be used to power electronic devices within the system under test 189. Here, power connection 133 is shown to provide a supply and return connection between power supply 101 and system under test 189. Within system under test 189, power may be distributed to the electronic devices 107, 109 and UUT 111.

Digital test instrument 103 contains multiple digital channels, 211A, 211, . . . 211D. A digital channel is a circuit that interfaces to a signal connection point of the test instrument so that it can drive and receive test signals at a test point in system under test 189. For the example used herein, each test point is a line of a digital bus 131.

The number of digital channels included in a digital test instrument 103 may depend on the specifics of the system under test 189. Also, in the example of FIG. 1 each of the digital channels 211A . . . 211D is illustrated to be identical. In the embodiment described herein, each digital channel is programmable such that each digital channel may perform a different function even though all digital channels have the same construction. A digital test instrument 103 may alternatively include digital channels of different designs to provide signals with different voltage levels, slew rates or other electrical characteristics. Accordingly, the specific configuration of digital test instrument 103 is not critical to the invention.

In the example of FIG. 1, digital test instrument 103 is configured to interface to UUT 111 through a digital bus 131. UUT 111 includes an interface 187 to bus 131. Digital bus 131 includes multiple signal lines. In this configuration, each digital channel 211A . . . 211D may generate or measure a signal on one line of digital bus 131. Other devices, such as device 107, also may be connected to bus 131 through a similar interface, such as interface 187A.

ATE 139 also includes an analog test instrument 105. Analog test instrument 105 includes multiple analog channels, here illustrated as analog channels 121 and 122. Each analog channel may generate and measure an analog test signal. Here analog channels 121 and 122 are shown connected to electronic devices 107 and 109, respectively. The specific connections are here used to illustrate principals of the invention and are not considered a limitation.

In operation, host computer 120 may run a software program that causes power supply 101, digital test instrument 103 and analog test instrument 105 to generate and measure signals on lines connected to system under test 189. Based on the measured values, host computer 120 may diagnose faults in system under test 189.

FIG. 1 also illustrates a problem that can arise in a test environment such as test environment 100. Power supply 101 is connected through connection 133A to digital bus 131. The output of power supply 101 may be a relatively high voltage. In contrast, the bus interface circuit 187 in UUT 111 may be designed to operate on relatively low voltage signals. For example, bus interface 187 may operate on signals having voltages less than 2.5 volts, but power supply 101 may output a voltage of 5 volts or more.

A conventional test system may detect a faulty power connection such as 133A. If power supply 101 generates a positive voltage, connection 133A will cause one line of bus 131 to always have a voltage that represents a logical one. Alternatively, if power supply 101 generates a negative voltage, connection 133A would cause one of the lines in digital bus 131 to always have a voltage representing a logical zero. Such a connection would create a "stuck at zero" fault. Stuck at one and stuck at zero faults may arise in other ways. For example, a faulty output of a device connected to digital bus 131 could also create a stuck at one or a stuck at zero fault. Traditional test instruments are designed to detect stuck at one and stuck at zero faults. Even though traditional test systems may detect incorrect interconnections or operation of devices, the test system could be improved if additional information beyond merely detecting the fault could be provided. A stuck at one fault or a stuck at zero fault indicates some portion of the system under test 189 is not operating properly or is not programmed correctly. However, there is often no urgency in detecting such a fault. Circuitry within the system under test and the test instrument are designed to process signals having values that represent a logical one or a logical zero. Accordingly, no damage to the system or test instrument necessarily results even if a particular line stays at logical one or logical zero for a long time.

In contrast, where a relatively high powered input is incorrectly provided to a low voltage digital device, damage to the device may occur. The damage may occur relatively quickly in a catastrophic fashion. Accordingly, it may be desirable to quickly disconnect from the test environment equipment that could be damaged by application of an over-voltage. Even when damage does not occur suddenly in a catastrophic fashion, damage from application of an over-voltage may become manifest as a premature failure of interface 187 after the electronic system is put into operation.

It is not, however, necessary that a voltage be so large as to cause physical damage in order to be considered over-voltage. Any voltage that is out of bounds or otherwise outside of the specified operating range may be considered "over voltage."

Over-voltage conditions may be created in other ways. For example, an over-voltage condition may be created by improper connection of an analog channel to digital bus 131. As another example, a digital channel may be programmed to drive a voltage level that exceeds the rated voltage of a digital line. Regardless of the source of the over-voltage condition, it would be desirable to detect the over-voltage condition and react to it or record that the condition occurred for fault identification or other purposes.

Test equipment according to the invention is designed to detect over-voltage situations, particularly on digital channels that are intended to receive low voltage signals. The ATE may be designed to respond to an over-voltage situation in one of multiple ways. ATE 139 may indicate to a user that a test failed when an over-voltage condition is detected. Upon failure of the test because of an over-voltage condition, ATE 139 may immediately terminate the test or continue to perform the test. If a test fails because of an over-voltage condition, information traditionally captured as a result of a test failure may be captured. For example, captured information may indicate when and where the over-voltage occurred. If the test continues after detection of an over-voltage condition, information about the number of times over-voltage conditions occur on each of the lines of the unit under test may be collected. Such information may be used for subsequent analysis to locate or correct defects in the electronic system under test 189 or the test environment 100.

Figure 2A:
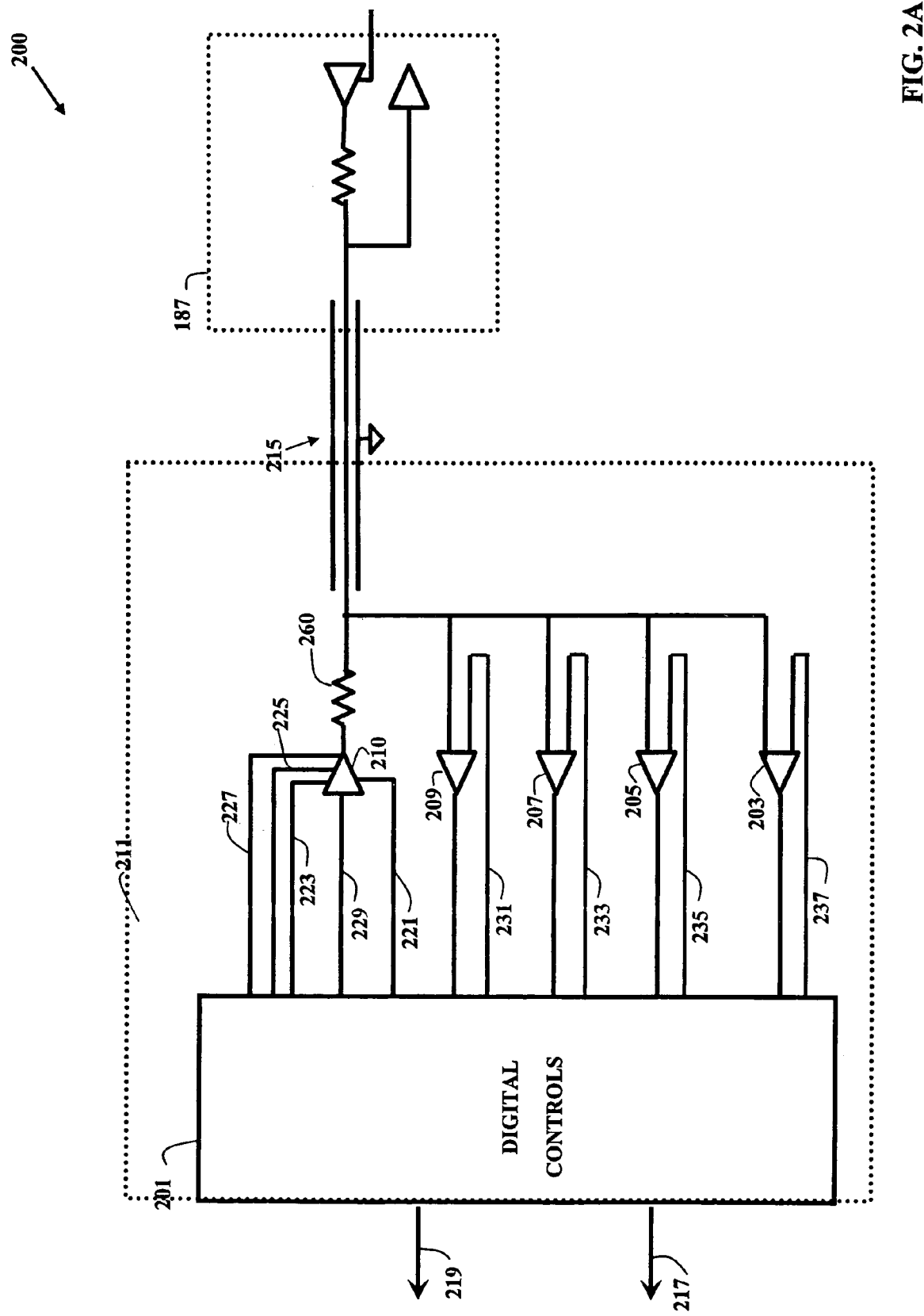
FIG. 2A is a circuit diagram of a portion of a digital test instrument according to one embodiment of the invention connected to a UUT.

FIG. 2A shows a digital channel 211 that may be used to detect over voltage conditions on a line 215, which may be a portion of digital bus 131. Digital channel 211 may include circuitry that is similar to prior art digital channels. Digital channel 211 includes a driver 210 that may output a programmable signal on line 215. Driver 210 may be a driver as used in a conventional digital test instruments, whether currently known or hereafter developed. Driver 210 is coupled to line 215 through resistor 260. Resistor 260 may be used to match the output impedance of driver 210 to the impedance of line 215, but other structures for impedance matching may be used or impedance matching may be omitted.

Driver 210 receives a data input 229, specifying whether driver 210 should drive a high or a low voltage on line 215. Control input 225 specifies the voltage level of the signal produced by driver 210 when it is driving a low level output. Control input 227 specifies the voltage level of the signal driven by driver 210 when it is driving a high level output. Control input 223 specifies the slew rate for the driver 210 as it transitions between a low level and high level output state. Control input 221 is an enable input. When control input 221 is disabled, driver 210 is "tri-stated," meaning it does not source or sink current on line 215.

The control inputs to driver 210 are provided by digital controls 201. Digital controls 201 may be any suitable control circuit. In one embodiment, digital controls 201 are implemented as a field programmable gate array (FPGA). However, any suitable circuit may be used to implement digital controls 201. Further, where an FPGA chip is used to implement digital controls 201, one chip may contain circuitry to control more than one digital channel.

Regardless of specific implementation, digital controls 201 generate the values on control inputs 221, 223, 225, 227 and 229 for driver 210. The specific values asserted on each of the control inputs, and the times at which those values are asserted, may be derived from a test program executing on host computer 120 or in any other suitable way. Typically, a test program is executed in cycles and each digital channel may generate or measure a different value during each cycle.

Digital channel 211 also includes two comparators 207 and 209 to sense the logical level of the signal on line 215. Comparators 207 and 209 may also be as in a conventional digital test instrument, whether currently known or hereafter developed. Each of the comparators 207 and 209 is coupled to the same signal connection point of digital test instrument 103 as driver 210 so that they may receive as an input the signal on line 215.

Comparator 209 receives a low threshold control input 231. Low threshold control input 231 specifies the maximum value at which channel electronics 211 will indicate that a low voltage is on line 215. When the value on line 215 is less than the value specified by low threshold control input 231, the output of comparator 209 is asserted.

Comparator 207 receives a high threshold control input 233. The value of high threshold control input 233 indicates the minimum value which channel electronics 211 will indicate that there is a high voltage on line 215. When the value on line 215 exceeds the high threshold control input specified on line 233, the output of comparator 207 is asserted.

Both the low threshold control input 231 and the high threshold control input 233 are generated by digital controls 201. As with the controls for driver 210, the controls for comparators 207 and 209 are generated by digital control circuit 201 based on programming of a test program within host computer 120. In operation, digital control circuit 201 is programmed with the expected value on line 215. Digital control circuit 201 compares the outputs of comparators 207 and 209 to the programmed expected value. Based on the comparison, digital control circuit 201 places a value on pass/fail output 219. If the comparators 207 and 209 indicate that the value on line 215 has the expected value, the value on 219 will indicate that the comparison passed. Conversely, if the comparators 207 and 209 do not indicate that the value on line 215 has the expected value, pass/fail output 219 will have a value indicating the comparison failed.

In operation, the signal on line 215 may be sensed during every cycle of operation of digital test instrument 103. The specific time during the cycle at which the value is sensed is sometimes called the "measurement window." The time of the measurement window may also be programmed. The value on pass/fail output 219 may be recorded for each cycle of operation of channel electronics 211. The recorded pass/fail values may be analyzed to determine whether there are faults within system under test 189.

Comparators 207 and 209 indicate whether the level of the signal on line 215 is above or below certain threshold levels that characterize normal operating conditions. They do not indicate the extent to which the signal is above or below the threshold. Accordingly, they do not indicate whether the voltage on line 215 is above the rated operating voltage or below the rated operating voltage of components connected to line 215. Either condition could cause damage to the components and both are referred to generically as an over-voltage condition.

Comparators 203 and 205 are incorporated into digital channel 211 to detect over-voltage conditions. Comparators 203 and 205 may be of the same construction as comparators 207 and 209. However, any suitable construction for comparators 203 and 205 may be used. Comparator 205 receives a low over-voltage control input 235. Comparator 203 receives a high over-voltage control input 237. When the value on line 215 falls below the voltage specified by low over-voltage control input 235, comparator 205 asserts its output. Similarly, when the voltage on line 215 exceeds the value specified by high over voltage controlled input 237, comparator 203 asserts its output.

In operation, the value of low over-voltage control input 235 and high over-voltage control input 237 are set based on the voltage levels that may cause damage to either the system under test 189 or test system 139. In a particular test environment, damage to test instrument 103 caused from unexpected signals from the UUT or other components within the test environment may be of concern. In other scenarios, damage to UUT 111 caused by unexpected signals from test system 189 or shorts within UUT 111 may be of concern. In other scenarios, damage to system 189 from improper operation of UUT may be of concern. In other scenarios, some or all of the above may be of concern. Regardless of the specific concerns, the control inputs may be set accordingly.

The outputs of comparators 203 and 205 are provided to digital control circuit 201. Digital control circuit 201 includes logic that sets the value on safe/alarm output 217 based on the values output by comparators 203 and 205. If the output of either comparator 203 or 205 indicates an over-voltage condition, digital control circuit 201 sets the value on safe/alarm output 217 to indicate an over-voltage condition has occurred. Conversely, when neither the output of comparator 203 nor 205 is asserted, digital control circuit 201 sets the output on safe/alarm output 217 to indicate that no over-voltage condition occurred.

The value at safe/alarm output 217 may be captured during each cycle of operation of digital channel 211 in the same way that pass/fail output 219 is captured. This information may be passed to host computer 120 to analyze the operation of the system under test 189. For example, the values on safe/alarm output 217 may be used to determine whether bus interface circuit 187 is being stressed by over-voltages. Such information may be used to predict premature failure of unit under test 111. It may also be used to diagnose unintended operating conditions that could represent either a design or manufacturing defect in system under test 189 or improper construction of test environment 100. Because the output of driver 210 and the inputs of comparators 203 and 205 are both connected to line 215, the value of safe/alarm output 217 can even indicate incorrect operation or programming of driver 210.

The information at safe/alarm output 217 may be captured in a failure capture memory or other suitable circuit in the same way that information at the pass/fail output 219 is captured. It may be captured by circuitry within digital test instrument 103. It may alternatively be captured in other circuitry, such as in circuitry within host computer 120.

Information from safe/alarm output 217, once captured, may be used to detect and/or diagnose the cause of over-voltage conditions. For example, the pattern of cycles in which the over-voltage condition occurs may be examined to identify a correlation between the over-voltage condition and a particular action within the test environment. For example, a correlation between an over-voltage condition on a line and electronic device 107 driving that line may indicate a fault within electronic device 107.

Alternatively, it is not necessary that information from safe/alarm output 217 be captured for later processing. Safe/alarm output 217 may be used to trigger protective action. For example, host computer 120 may receive an indication from digital test instrument 103 that an over-voltage condition has occurred on a line of digital bus 131. Host computer 120 may then send control signals to switch matrix 123 that opens a switch to disconnect that line from unit under test 111. In this way, the interface circuit 187 is protected from damage from an over-voltage condition.

Other immediate actions may be taken. As another alternative, a value of safe/alarm output 217 indicating an over-voltage condition may trigger termination of a test. Terminating the test may, for example, result in the device causing the over-voltage condition to be disabled. In some scenarios, it is possible that digital test instrument 103 may be the source of the failure. Terminating the test may cause digital test instrument 103 to disable control input 221 so that driver 210 is tri-stated, thereby removing the over-voltage condition.

In one embodiment, comparators 203 and 205, which detect over-voltage conditions, may operate at times that are independent of the operation of comparators 207 and 209, which measure whether the signal on line 215 is a logical high or low. In this embodiment, comparators 207 and 209 may detect an over-voltage condition even when comparators 203 and 205 are not in operation, such as when driver 210 is driving a signal on line 215. In this way, comparators 203 and 205 may be controlled to detect an over-voltage condition on line 215, even an over-voltage condition caused by driver 210.

Figure 2B:
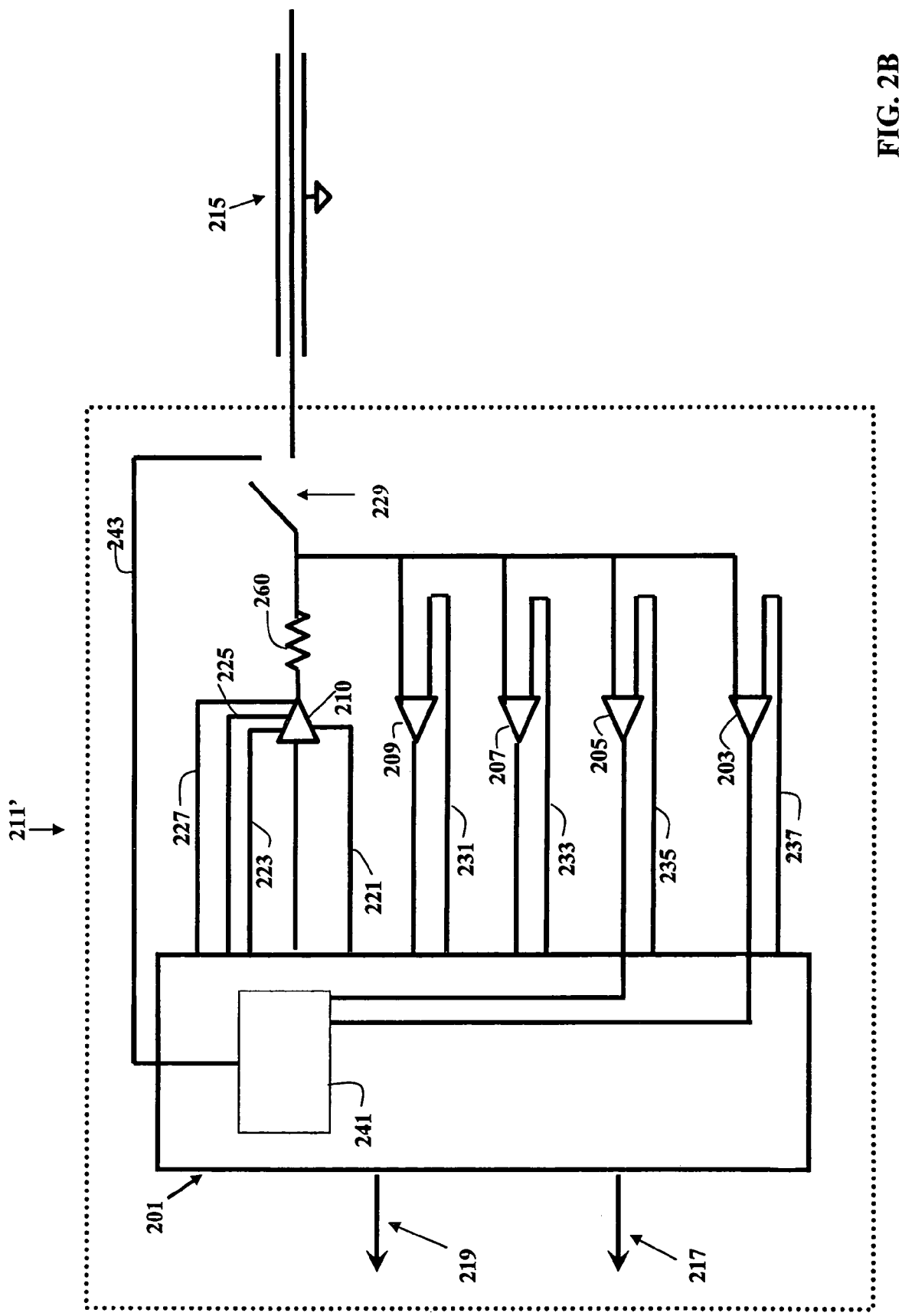
FIG. 2B is a circuit diagram of a portion of a digital test instrument according to an alternative embodiment of the invention.

FIG. 2B illustrates an alternative embodiment in which the detection of an over-voltage condition triggers an action. In the embodiment of FIG. 2B, the outputs of comparators 203 and 205 are provided to monitoring circuit 241. Monitoring circuit 241 may initiate a defined action in response to the output of either comparator 203 or 205 indicating that an over-voltage condition has occurred.

In the illustration of FIG. 2B, control line 243 from monitoring circuit 241 controls switch 229. Switch 229 is a normally closed switch. It may be implemented as a solid state switch, a mechanical switch, such as a relay, or in any other suitable way.

Upon detection of an over-voltage condition, monitoring circuit 241 asserts control line 243, opening switch 229. With switch 229 open, channel 211 is disconnected from line 215. If driver 210 is causing the over-voltage condition, other electronic components connected to line 215 will be protected from the over-voltage condition. Alternatively, if a device external to the digital test instrument 103 is causing the over-voltage condition, opening the switch may protect circuitry within digital test instrument 103 from damage.

The output of monitoring circuit 241 may be latched so that the switch 229 stays open until it is reset. Alternatively, the output may stay asserted only for so long as one of the comparators 203 and 205 indicates an over-voltage condition exists.

The output of monitoring circuit 241 may control other actions in response to an over-voltage condition. The output may alternatively or additionally be connected to one or more switches located in other positions within test environment 100. A similar protective switch may be connected to the input of each device on line 215 such that all devices are disconnected from the line if an over-voltage condition occurs. Or, similar switches may be connected across all digital lines, such that all low-voltage digital devices are disconnected in the event of an over-voltage condition, even if the condition is not detected on all lines.

Turning now to FIGS. 3A to 3H, operating conditions on line 215 are shown. Here four threshold values are shown. THRESHOLD_V1 represents the value on low threshold control input 231. THRESHOLD_V2 represents the value on high threshold control input 233. THRESHOLD_V3 represents the value on low over-voltage control input 235. THRESHOLD_V4 represents the value on high over-voltage control input 237.

FIG. 3A shows one cycle of a signal on line 215. In a sample window 310A, the signal has a value above THRESHOLD_V2 and below THRESHOLD_V4. When channel 211 is programmed to expect a HI signal, this signal level matches the expected result. Accordingly, pass/fail output 219 has a value indicative of a "pass" result, which is represented by the legend of FIG. 3A stating "RESULT=PASS." The signal level is below THRESHOLD_V4 and above THRESHOLD_V3. This voltage does not correspond to an over-voltage condition. Accordingly, the value on safe/alarm output 217 indicates that there is no over-voltage condition, which is represented by the legend of FIG. 3A stating "ALERT=NONE."

FIG. 3B shows a subsequent cycle of the signal on line 215. In a sample window 310B, the signal has a value that is above THRESHOLD_V1 but below THRESHOLD_V2. This value corresponds to neither a HI nor a LO, and will result in no match with the expected value. Accordingly, pass/fail output 219 has a value indicative of a "fail" result. The signal level is below THRESHOLD_V4 and above THRESHOLD_V3. This voltage does not correspond to an over-voltage condition. Accordingly, the value on safe/alarm output 217 indicates that there is no over-voltage condition.

FIG. 3C shows a further cycle of the signal on line 215. In a sample window 310C, the signal has a value above both THRESHOLD_V2 and THRESHOLD_V4. When channel 211 is programmed to expect a HI signal, this signal level matches the expected result. Accordingly, pass/fail output 219 has a value indicative of a "pass" result. The signal level is above the high over-voltage control input. This voltage corresponds to an over-voltage condition. Accordingly, the value on safe/alarm output 217 indicates that there is an over-voltage condition. In the example of FIG. 3C, digital test instrument 103 is programmed so that the value on the pass/fail output 219 is independent of the value on safe/alarm output 217.

FIG. 3D shows a further cycle of the signal on line 215. In sample window 310D, the signal has a value above THRESHOLD_V2 and below THRESHOLD_V4. When channel 211 is programmed to expect a HI signal, this signal level matches the expected result. Accordingly, pass/fail output 219 has a value indicative of a "pass" result. The signal level is below the high over-voltage control input and above the low over-voltage control input. This voltage does not correspond to an over-voltage condition. Accordingly, the value on safe/alarm output 217 indicates that there is no over-voltage condition. FIG. 3D shows a transient 320D that momentarily exceeds THRESHOLD_V4. However, in the example illustrated, digital test instrument 103 is configured to ignore switching transients by only using the outputs of comparators 203 and 205 during a sample window 310D to set the value of safe alarm output 217. As in conventional digital test instrument, the timing of the sample window may be programmed. In this example, the time of sample window 310D is selected to be after switching transients at the start of a cycles have died away.

FIG. 3E shows a further cycle of the signal on line 215. In a sample window 310E, the signal has a value below THRESHOLD_V1. When channel 211 is programmed to expect a LO signal, this signal level matches the expected result. Accordingly, pass/fail output 219 has a value indicative of a "pass" result. The signal level is above THRESHOLD_V3 and below THRESHOLD_V4. This voltage does not correspond to an over-voltage condition. Accordingly, the value on safe/alarm output 217 indicates that there is no over-voltage condition.

FIG. 3F shows a further cycle of the signal on line 215. In a sample window 310F, the signal has a value above THRESHOLD_V1 and below THRESHOLD_V2. This value corresponds to neither a HI nor a LO, and will result in no match with the expected value. Accordingly, pass/fail output 219 has a value indicative of a "fail" result. The signal level is below THRESHOLD_V4 and above THRESHOLD_V3. This voltage does not correspond to an over-voltage condition. Accordingly, the value on safe/alarm output 217 indicates that there is no over-voltage condition.

FIG. 3G shows a further cycle of the signal on line 215. In a sample window 310G, the signal has a value below both THRESHOLD_V1 and THRESHOLD_V3. When channel 211 is programmed to expect a LO signal, this signal level matches the expected result. However, in this example, digital test instrument 103 is programmed to issue a "fail" test result in any over-voltage situation. In this example, the signal level is below the low over-voltage control input. This voltage corresponds to an over-voltage condition. Accordingly, the value on safe/alarm output 217 indicates that there is an over-voltage condition and the value on pass/fail output 219 indicates a "fail."

FIG. 3H shows a further cycle of the signal on line 215. In sample window 310H, the signal has a value below THRESHOLD_V1. When channel 211 is programmed to expect a LO signal, this signal level matches the expected result. Accordingly, pass/fail output 219 has a value indicative of a "pass" result. In the sample window 310H, the signal level is below the high over-voltage control input and above the low over-voltage control input. This voltage does not correspond to an over-voltage condition. However, in the cycle illustrated in FIG. 3H, the signal undergoes a transient 320H. Transient 320H has a peak that is below THRESHOLD_V3. In this embodiment, digital test instrument 103 is constructed to be sensitive to any over-voltage condition during a cycle of duration 312H, and not just during a sample window. Accordingly, the value on safe/alarm output 217 indicates that there is an over-voltage condition.

FIGS. 3A . . . 3H illustrate various possible methods of operation of digital test instrument 103. The over-voltage indication may be based on signal levels at a programmed time or may reflect a signal level exceeding a threshold at any time. The pass/fail output may indicate a fail result, regardless of expected value if an over-voltage condition occurs or the pass/fail output may be set independently of the over-voltage condition. In one embodiment, digital test instrument 103 is programmable such that digital controls 201 will produce the desired operating characteristics. Digital controls 201 may be implemented in any suitable way to provide the desired programmable control.

Figure 4:
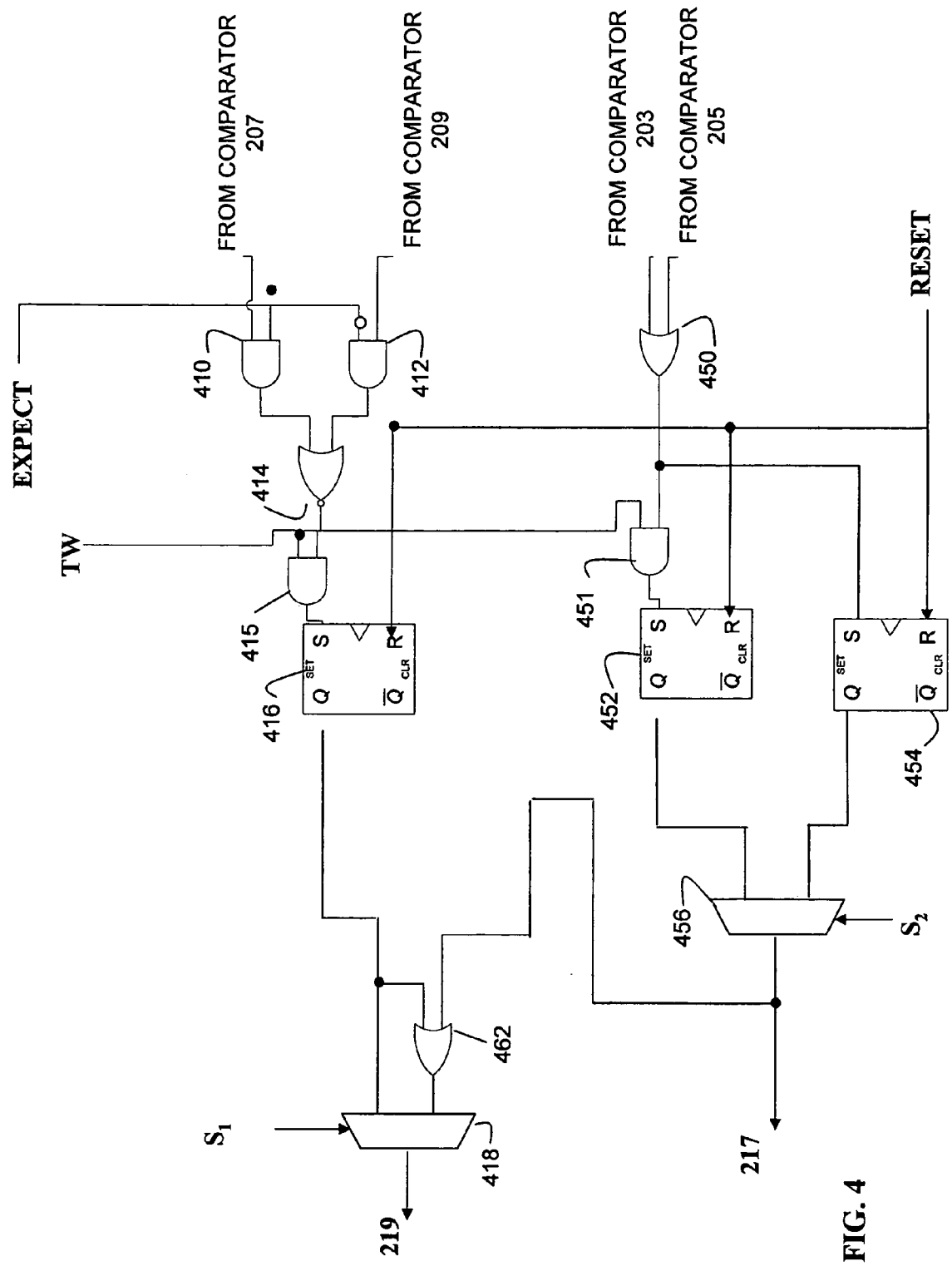
FIG. 4 is a simplified schematic of circuitry that may be included in digital controls 201 of FIG. 2.

For example, FIG. 4 shows circuitry that may be included in digital controls 201 to provide the desired programmability. A programmed expect value gates the outputs of comparators 207 and 209. The output of comparator 207 is applied as an input to AND gate 410. The output of AND gate 410 is a logical high when the expected value is a logical high and the output of comparator 207 indicates the signal in 215 has a value exceeding the high threshold control input.

The output of comparator 209 is applied as an input to AND gate 412. The second input to AND gate 412 is an inverting input, which receives the expected value signal. The output of AND gate 412 is a logical high when the expected value is a logical low and the output of comparator 209 is a logical high, indicating that the signal on line 215 is below the low threshold controlled input.

The outputs of AND gate 410 and 412 are combined at NOR gate 414 to produce a signal indicating that a failure has occurred. The output of NOR gate 414 is a logical high when neither AND gate 410 nor 412 indicates that the programmed expected value was detected.

The output of NOR gate 414 is gated through AND gate 415 and captured in flip-flop 416. The second input to AND gate 415 is a TW control signal. The TW control signal is a programmable signal. The timing of the TW control signal may be programmed to specify a sample window. If a failure occurs while the TW signal is asserted, the output of NOR gate 414 will be asserted. The output of NOR gate 414 will be gated through AND gate 415, causing the set input of flip-flop 416 to be asserted. The output of flip-flop 416 will stay asserted until the RESET signal is applied, which in this example, is applied after the sample window. If the output of NOR gate 414 indicates an unexpected operating condition at any time other than when the TW control signal is asserted, it is not gated through AND gate 415 and has no impact on the output of flip-flop 416.

The output of comparators 203 and 205 are provided to OR gate 450. The output of OR gate 450 indicates that the signal on line 215 has a voltage level that exceeds the high over-voltage control input or is below the low over-voltage control input. In this embodiment either condition is regarded as an over-voltage condition.

The output OR gate 450 is gated through AND gate 451 and captured in flip-flop 452. The second input to AND gate 451 is the TW control signal. If an over-voltage condition occurs while the TW signal is asserted, the output of OR gate 450 will be asserted. The output of OR gate 450 will be gated through AND gate 451, causing the set input of flip-flop 452 to be asserted. The output of flip-flop 452 will stay asserted until the RESET signal is applied, which in this example, is applied after the sample window. If the output of OR gate 450 indicates an over-voltage condition at any time other than when the TW control signal is asserted, it will not be gated through AND gate 451 and has no impact on the output of flip-flop 452.

In the example of FIG. 4, flip-flop 452 is controlled by the same control input as flip-flop 416. However, the flip-flops may be independently controlled.

The output of OR gate 450 is also provided in a parallel path to the set input of flip-flop 454. If the set input to flip-flop 454 becomes a logical high at any time that flip-flop 454 is enabled, the output of flip-flop 454 will latch in a logical high state. The output of flip-flop 454 will stay in a logical high state until flip-flop 454 receives a reset input. The reset input to flip-flop 454 is also a programmable signal. Flip-flop 454 may, for example, be reset once per cycle of digital test instrument. In this scenario, flip-flop 454 indicates whether an over-voltage condition occurred at any time during the cycle. Alternatively, flip-flop 454 may be reset once per test. In this scenario, the output of flip-flop 454 indicates that an over-voltage condition occurred during the test.

The outputs of flip-flop 450 and flip-flop 454 are provided to a multiplexer 456. Multiplexer 456 has a programmable control input $S_2$. The value of $S_2$ may be set to select with multiplexer 456 either the output of flip-flop 452 or the output of flip-flop 454. When multiplexer 456 selects the output of flip-flop 452, safe/alarm output 217 indicates whether an over-voltage condition occurred during the sample window specified by the TW control signal. Alternatively, when multiplexer 456 selects the output of flip-flop 454, safe/alarm output 217 indicates that an over-voltage condition occurred, regardless of whether the over voltage condition occurred during the sample window.

The circuit of FIG. 4 also includes a multiplexer 418 that allows pass/fail output 219 to be programmed to reflect the results of safe/alarm output 217 or to be independent of the value of safe/alarm output 217. When control input $S_1$ to multiplexer 418 selects the output of flip-flop 416, the value of pass/fail output 219 is independent of the value of safe/alarm output 217. The second input to multiplexer 418 is generated by combining at OR gate 462 the output of flip-flop 416 with the safe/alarm output 217. If either safe/alarm output 217 indicates that an over-voltage condition has been detected or the output of flip-flip 416 indicates a test failure occurred because the measured value did not match the expected value, the output of OR gate 462 will indicate a failure. Conversely, when safe/alarm output 217 indicates no over-voltage condition has occurred and the output of flip-flop 416 indicates no failure was detected, the output of OR gate 462 will take on a value indicating a pass.

Having thus described several aspects of at least one embodiment of this invention, it is to be appreciated various alterations, modifications, and improvements will readily occur to those skilled in the art.

For example, it is described that operating conditions in which the voltage on a line is higher than a specified level or lower than a specified level are both over-voltage conditions. It is not necessary that conditions in which the voltage is too low and conditions in which the voltage is too high be represented the same way. The conditions could be represented as an over-voltage and an under-voltage condition and a test program may record or respond to an over-voltage and an under-voltage condition differently.

As another example, drivers and comparators are shown connected directly to a signal line 215. A channel may include impedance matching elements, buffer amplifiers, signal dividers, switches and/or other circuit elements through which the drivers and comparators may be coupled to the signal connection point of the test instrument. Other circuit elements may be connected to the signal connection point, such as an active load. As a further example, signals may be coupled to any or all of the comparators through circuitry that processes differential input signals, to allow the test system as described above to operate on either single ended or differential signals. The processing may result in either the differential or common mode components of a differential signal being applied to one or more comparators. As a result, the test equipment may determine whether a differential signal has an expected value of its differential and/or common mode component and whether or not the differential and/or common mode component is out of bounds.

Where the test instrument operates on differential signals, and it is determined that the signal is out of bounds, a connection in the system may be interrupted. The connection could be to the test instrument, the UUT or to another component of the test environment that is believed to be creating the out of bounds condition. When breaking a connection carrying a differential signal, it may be preferable to disconnect both legs of the differential signal.

As a further example of the embodiments that are possible, FIG. 2B shows a switch 229 controlled by a hardware component, in this example, a monitoring circuit 241. In contrast, FIG. 1 shows a switch matrix 123. Switch matrix 123 is controlled by signals from host computer 121. The control signals from host computer 121 may be generated by software executing on host computer 121 or may be generated by special hardware installed in host computer 121. Regardless of the specifics of implementation, a switch may be opened in response to over-voltage values sensed.

Further, protective switches are shown to be normally closed switches that open to break a connection when activated. As an alternative, switches could be normally open and close to create a path to ground in the event of an over-voltage condition.

A further example, digital test instrument 103 may include other circuitry to process the outputs of comparators 203 and 205. For example, monitoring circuit 241 (FIG. 2B) may be designed to avoid triggering on a transient over-voltage condition, such as shown in FIG. 3D or 3H. Monitoring circuit 241 may contain a circuit that has a low pass filter characteristics and therefore acts as a low pass filter. The circuit could perform other signal processing functions or could perform only the low pass filter function. The low pass filter may be a digital low pass filter. Alternatively, the low pass filter could be implemented in whole or in part with analog signal processing techniques.

Filtering the output of comparators 203 and 205 reduces the effect of transient portions of the signal output by comparators 203 and 205. A low pass filter or delay element is therefore desirable in circumstances where it is desirable not to trigger an alarm output when the voltage on line 215 momentarily exceeds a set level.

Furthermore, drivers and comparators are shown connected to the same signal lead to allow bidirectional operation of each channel. The invention could be employed where separate channels are used to drive and receive a signal connection point.

Likewise, separate comparators are shown to measure expected values during a test and to detect over-voltage conditions. It is not necessary that separate comparators be present. The same comparator circuit could be used to make a test measurement and an over-voltage measurement. For example, the comparator could be programmed with different threshold values to, at one time, be a test comparator and, at other times, be an over-voltage comparator.

In a similar fashion, the outputs of digital control circuit 201 could be multiplexed. For example, one output could, at one time, be a line representing whether the value on line 215 has an expected value and at other times could be a line representing whether the value on line 215 is in an over-voltage state.

Such alterations, modifications, and improvements are intended to be part of this disclosure, and are intended to be within the spirit and scope of the invention. Accordingly, the foregoing description and drawings are by way of example only.

What is claimed is:

1. Automatic test equipment adapted to execute a user program, the test equipment comprising a channel circuit having a signal connection point adapted to be coupled to a signal line of a unit under test to receive an input signal having a value, the channel circuit comprising:
   a) at least two comparison sub-circuits, each comparison sub-circuit having a signal input coupled to the signal connection point, a threshold input adapted to receive a threshold input signal having a value and a comparison output, and wherein each of the comparison sub-circuits is adapted to produce a comparison output signal at the comparison output having a value indicating the value of the input signal relative to the value of the threshold input signal; and
   b) control circuitry having at least two measured value inputs, each measured value input coupled to the comparison output of one of the at least two comparison sub-circuits, a test output and an over-voltage output, the control circuitry adapted to generate a test output from a first subset of the comparison output signals produced by the at least two comparison sub-circuits and to generate the over-voltage output from a second subset of the comparison output signals produced by the at least two comparison sub-circuits; and
   c) wherein the automatic test equipment is adapted to independently set the value of the threshold input signal for each of the at least two comparison sub-circuits based on the user program.

2. The automatic test equipment of claim 1 comprising a plurality of channel circuits, each channel circuit comprising:
   a) at least two comparison sub-circuits, each comparison sub-circuit having a signal input coupled to the signal connection point, a threshold input adapted to receive a threshold input signal having a value and a comparison output, and wherein each of the comparison sub-circuits is adapted to produce a comparison output signal at the comparison output having a value indicating the value of the input signal relative to the value of the threshold input signal; and
   b) control circuitry having at least two measured value inputs, each measured value input coupled to the comparison output of one of the at least two comparison sub-circuits, a test output and an over-voltage output, the control circuitry adapted to generate a test output from a first subset of the comparison output signals produced by the at least two comparison sub-circuits and to generate the over-voltage output from a second subset of the comparison output signals produced by the at least two comparison sub-circuits.

3. The automatic test equipment of claim 2 wherein the at least two comparison sub-circuits in each of the plurality of channel circuits comprises four comparison sub-circuits and each channel circuit additionally comprises a driver.

4. The automatic test equipment of claim 1 wherein the control circuitry comprises at least two threshold outputs, each coupled to the threshold input of one of the at least two comparison sub-circuits, and wherein the control circuitry is adapted to provide a signal having a programmable value at each of the threshold outputs.

5. The automatic test equipment of claim 1 wherein the test output of the control indicates the state of the comparison output signal of at least one of the at least two comparison sub-circuits relative to an expected state and the over-voltage output indicates the state of the comparison output signal of at least one of the at least two comparison sub-circuits.

6. The automatic test equipment of claim 5 wherein the state of the over-voltage output is based on whether the signal at the signal input has a value between the values of the signals at the threshold inputs of two of the at least two comparison sub-circuits.

7. The automatic test equipment of claim 6 additionally comprising a driver coupled to the signal connection point and disconnect circuitry connected between the output of the driver and the signal connection point, the disconnect circuitry having a control input coupled to the over-voltage output of the control circuitry.

8. The automatic test equipment of claim 7 wherein the control circuitry comprises at least one low pass filter and/or delay element coupled between the over-voltage output and the comparison outputs of the two of the at least two comparison sub-circuits.

9. Automatic test equipment of the type having a plurality of signal connection points, the automatic test equipment comprising a plurality of circuits, each of the circuits having a signal input coupled to a respective one of the signal connection points and adapted to receive as an input signal a signal at the signal connection point, the input signal having a value, with the test equipment adapted to compare the value of the input signal to at least one expected value to generate a test result, and wherein each of the circuits comprising:

a) a threshold input adapted to receive at least one threshold input signal having a value;

b) a comparison sub-circuit coupled to the threshold input and the signal input, the comparison sub-circuit having a comparison output indicating the value of the input signal relative to the value of the threshold input signal; and c) control circuitry having a measured value input coupled to the comparison output of the comparison sub-circuit to receive a measured value signal having a value, the control circuitry adapted to generate an output based on the value of the measured value signal, with the output being a test result and/or being an over-voltage indication.

10. The automatic test equipment of claim 9 additionally comprising a host computer operatively coupled to the control circuit to receive a value representative of the over-voltage indication.

11. The automatic test equipment of claim 10 wherein the automatic test equipment is installed in a test environment comprising a unit under test having an input coupled to the automatic test equipment and a switch coupled between the automatic test equipment and the unit under test wherein, and the host computer is programmed to actuate the switch selectively in response to the value of the over-voltage indication.

12. The automatic test equipment of claim 9 wherein each of the plurality of circuits comprises a switch having a control input, the switch coupled between the respective input signal connection point and the comparison sub-circuit, wherein the over-voltage indication is coupled to the control input of the switch.

13. The automatic test equipment of claim 9 wherein the control circuitry additionally comprises a plurality of threshold outputs coupled to the threshold input.

* * * * *